(12) United States Patent
Salvi

(10) Patent No.: US 8,970,293 B1
(45) Date of Patent: Mar. 3, 2015

(54) ACTIVE RC FILTER HAVING GAIN-SETTING ATTENUATOR

(71) Applicant: Motorola Solutions, Inc., Schaumburg, IL (US)

(72) Inventor: Raul Salvi, Boca Raton, FL (US)

(73) Assignee: Motorola Solutions, Inc., Schaumburg, IL (US)

( * ) Notice: Subject to any disclaimer, the term of this patent is extended or adjusted under 35 U.S.C. 154(b) by 0 days.

(21) Appl. No.: 14/066,224

(22) Filed: Oct. 29, 2013

(51) Int. Cl.
*H03K 5/00* (2006.01)
*H03H 11/12* (2006.01)

(52) U.S. Cl.
CPC .................................. *H03H 11/126* (2013.01)
USPC .......................................... 327/553; 327/552

(58) Field of Classification Search
USPC .................. 327/551–554, 336–337
See application file for complete search history.

(56) References Cited

U.S. PATENT DOCUMENTS

| | | | |
|---|---|---|---|
| 4,857,778 | A | 8/1989 | Hague |
| 5,418,492 | A | 5/1995 | Wang et al. |
| 5,953,430 | A | 9/1999 | Kirchlechner et al. |
| 6,909,323 | B2 * | 6/2005 | Ueno et al. ............... 330/86 |
| 7,138,873 | B2 * | 11/2006 | Chandra et al. ............... 330/303 |
| 8,044,718 | B2 | 10/2011 | Nicollini et al. |
| 8,054,208 | B2 * | 11/2011 | Fletcher et al. ............... 341/141 |
| 8,111,096 | B2 | 2/2012 | Oishi |
| 2006/0038610 | A1 | 2/2006 | Gudem et al. |

FOREIGN PATENT DOCUMENTS

| | | |
|---|---|---|
| EP | 1923998 A2 | 5/2008 |
| EP | 1675263 B1 | 10/2009 |
| WO | WO2005060095 A1 | 6/2005 |

OTHER PUBLICATIONS

Clavo, et al., "A Linear CMOS Gm-C-OTA Biquad Filter with 10-100 MHz Tuning", The 47th IEEE International Midwest Symposium on Circuits and Systems, Jul. 25-28, 2004, pp. I-61-I-64.

Kaewdang, et al., "A Wide Tunable Range CMOS OTA", Electrical Engineering/Electronics, Computer, Telecommunications and Information Technology, 2008. ECTI-CON 2008. 5th International Conference on, May 14-17, 2008, pp. 705-708.

Martins, et al., "SC Biquad Filter with Hybrid Utilization of OpAmp and Comparator based Circuit", Circuits and Systems (ISCAS), Proceedings of 2010 IEEE International Symposium on, May 30, 2010-Jun. 2, 2010, pp. 1276-1279.

(Continued)

*Primary Examiner* — Dinh Le

(74) *Attorney, Agent, or Firm* — Steven A. May; Daniel R. Bestor

(57) ABSTRACT

Disclosed herein are embodiments of an active RC filter that has a gain-setting attenuator. An embodiment takes the form of a filter circuit having a filter-circuit input node; a filter-circuit output node; an operational amplifier (op-amp) having first and second inputs and also having an output coupled to the filter-circuit output node; and a passive feedback path extending between the filter-circuit output node and the first op-amp input, the passive feedback path having a gain-setting attenuator segment in series with a signal-filtering segment.

18 Claims, 12 Drawing Sheets

SINGLE-ENDED ACTIVE RC FILTER
HAVING GAIN-SETTING ATTENUATOR

(56) References Cited

OTHER PUBLICATIONS

Maheshwari, et al., "Electronically tunable low-voltage mixed-mode universal biquad filter", Circuits, Devices & Systems, IET (vol. 5, Issue: 3), May 2011, pp. 149-158.

Wang, et al., "Cost-efficient CMOS RF tunable bandpass filter with active inductor-less biquads", Circuits and Systems (ISCAS), 2012 IEEE International Symposium on, May 20-23, 2012, pp. 2139-2142.

* cited by examiner

ACTIVE RC FILTER HAVING GAIN-SETTING ATTENUATOR

BACKGROUND OF THE INVENTION

In general, signal processing refers to the techniques and processes by which analog and digital signals are created, transmitted, received, and interpreted, among other functions. In many instances, the signals are electromagnetic signals that are processed using various electrical circuits, one common type of which is filter circuits ("filters"), which operate in a frequency-dependent manner to completely or partially suppress or remove one or more components of a given signal. Thus, a given filter may receive a signal having a number of different components in the frequency domain, and operate to output only a subset of those components while suppressing the others, which could represent interference or noise, among other possibilities.

As is known in the art, filters come in many shapes and sizes. A common delineation among filters is between passive filters and active filters. Passive filters include only reactive (i.e., non-powered) circuit elements such as resistors, capacitors, and inductors. Active filters include at least one active (i.e., powered) element such as an operational amplifier (or "op-amp").

Another common delineation among filters is between single-ended filters and multiple-ended filters. Single-ended filters have only a single input node and a single output node. Multiple-ended filters have multiple input nodes and multiple output nodes. A common type of multiple-ended filters is double-ended filters, which have two input nodes and two output nodes. Double-ended filters are often referred to as "differential" filters (having (two) "differential" input nodes and (two) "differential" output nodes). For illustration and not limitation, this disclosure discusses single-ended and differential filters rather than single-ended and multiple-ended filters.

Moreover, another common delineation among filters is according to what the filter does, i.e., according to the type of transfer function collectively realized by the properties and arrangement of the filter's composite elements. As is known to those of skill in the art, some common types of filters—when categorized according to transfer function—are low-pass filters, high-pass filters, band-pass filters, band-stop (or "notch") filters, and all-pass filters, though many other types abound.

Using a single-ended topology by way of example and not limitation, one common type of active filter includes an op-amp and a passive signal-filtering RC (resistor-capacitor) network as a feedback path between (i) the output node of the filter (which is coupled to the output node of the op-amp) and (ii) one of the two inputs of the op-amp. The passive signal-filtering RC network is typically also separately coupled to the input node of the filter. It is the collective properties and arrangement of this passive signal-filtering RC network that cause the filter as a whole to exhibit its characteristic transfer function, i.e., that cause the filter to be a low-pass filter, a high-pass filter, a band-pass filter, or perhaps another type. Such filters are generally and herein referred to as "active RC filters."

As is also the case with filters having other topologies, and as is known to those of skill in the art, active RC filters are often characterized by a set of performance metrics (or "performance factors"), some common examples of which are the gain ($H_o$), the bandwidth ($\omega_o$), the quality factor ("Q factor" or just "Q"), and the damping ratio ("zeta ($\zeta$)" or just "Z"). These performance metrics are discussed in a general way below, though this discussion is meant to aid the reader and not to restrict the discussed performance metrics to the definitions and explanations that are given below. And there are other examples of performance metrics as well.

The gain of a filter is a (usually logarithmic) ratio of the signal output of the filter to the signal input of the filter. If this ratio is greater than one, the filter is said to amplify its input signal. If this ratio is less than one, the filter is said to attenuate its input signal. In various different contexts, it may be desirable to implement a filter having a large attenuating effect, a small attenuating effect, a small amplifying effect, or a large amplifying effect, among other options.

Gain can be measured and expressed in different ways, such as in terms of voltage, current, or power. For illustration and not by way of limitation, voltage gain is the type most discussed in this disclosure. The voltage gain of a filter is a (usually logarithmic) ratio of the voltage at the output node to the voltage at the input node. Those of skill in the art are familiar with transforming between and among different domains, and are aware of parallel constructs and concepts across domains (such as voltage dividers in the voltage domain and current dividers in the current domain, and the like). As such, the discussion below being in the context of the voltage domain-input voltages, output voltages, voltage dividers, and the like—is by way of example and not limitation, as those having skill in the art will readily appreciate that the constructs and concepts disclosed herein apply with equal force to other domains.

The bandwidth of a filter is a measure of the difference between what are referred to as the upper and lower cutoff frequencies of the filter, which are the upper and lower bounds of the frequency range over which the filter performs according to its characteristic transfer function. A common definition for a cutoff frequency is the frequency above which (in the case of an upper cutoff frequency) or below which (in the case of a lower cutoff frequency) the response (i.e., the output voltage) of the filter is at least 3 decibels (dB) less than the response of the filter in its operating range (i.e., between the upper and lower cutoff frequencies). Narrow-bandwidth filters are desirable in some contexts, while large-bandwidth filters are desirable in others.

The Q of a filter is a ratio of the center frequency of the operating range of the filter to the bandwidth of the filter, and as such is also a measure of what is known as the "slope" of the filter, as higher center frequencies and narrower bandwidths tend to increase the slope (in the context of a graph of the filter response as a function of the frequency of the input signal), while lower center frequencies and wider bandwidths tend to decrease the slope. As such, filters with operating ranges centered on higher frequencies will generally have higher Qs than will filters with operating ranges centered on lower frequencies. And filters with small bandwidths will generally have higher Qs than will filters with large bandwidths. Z is an inverse expression of Q. Thus, filters with high Qs have low Zs, and vice versa.

Again using a single-ended topology by way of example and not limitation, active RC filters are typically arranged such that the above-mentioned passive signal-filtering RC network is connected as a feedback path between (i) the output node (which, again, is the output node of both the op-amp and the filter as a whole) and (ii) the inverting differential input (or "the inverting input," often denoted "V−" or just "−") of the op-amp; the other input is the non-inverting differential input (or "the non-inverting input," often denoted "V+" or just "+").

In such an arrangement, the higher the overall attenuation (i.e., impedance, resistance, and the like) of the passive signal-filtering RC network of the filter, the higher the gain of the filter will be. The opposite, however, is true of bandwidth: the higher the overall attenuation of the passive signal-filtering RC network of the filter, the lower the bandwidth of the filter will be. Designers therefore face tradeoffs of gain (and Q) for bandwidth, and vice versa.

The inventor has identified a need for an active RC filter having a gain-setting attenuator; i.e., an active RC filter for which the gain can be changed without resulting in a change in either the bandwidth or the Q of the filter. Moreover, when a given context demands (or would at least benefit from) filters with multiple different {gain, Q, bandwidth} profiles, designers often have no choice but to include multiple parallel signal-processing paths. The inventor has also identified a need for an active RC filter having a gain-setting attenuator with which the gain of the filter can be adjusted during operation without affecting either the bandwidth or the Q of the filter.

BRIEF DESCRIPTION OF THE FIGURES

The accompanying figures, where like reference numerals refer to identical or functionally similar elements, together with the detailed description below, are incorporated into and form part of the specification, and serve to further illustrate embodiments of the following claims, and explain various principles and advantages of those embodiments.

Those having skill in the relevant art will appreciate that elements in the figures are illustrated for simplicity and clarity, and have not necessarily been drawn to scale. For example, the dimensions of some of the elements in the figures may be exaggerated relative to other elements to help to improve understanding of various embodiments. Furthermore, the apparatus and method components have been represented where appropriate by conventional symbols in the figures, showing only those specific details that are pertinent to understanding the disclosed embodiments so as not to obscure the disclosure with details that will be readily apparent to those having skill in the relevant art having the benefit of this description.

DETAILED DESCRIPTION

An embodiment takes the form of a filter circuit comprising: a filter-circuit input node; a filter-circuit output node; an op-amp comprising first and second op-amp inputs, the op-amp further comprising an op-amp output coupled to the filter-circuit output node; and a passive feedback path extending between the filter-circuit output node and the first op-amp input, the passive feedback path comprising a gain-setting attenuator segment in series with a signal-filtering segment.

Figure 1:
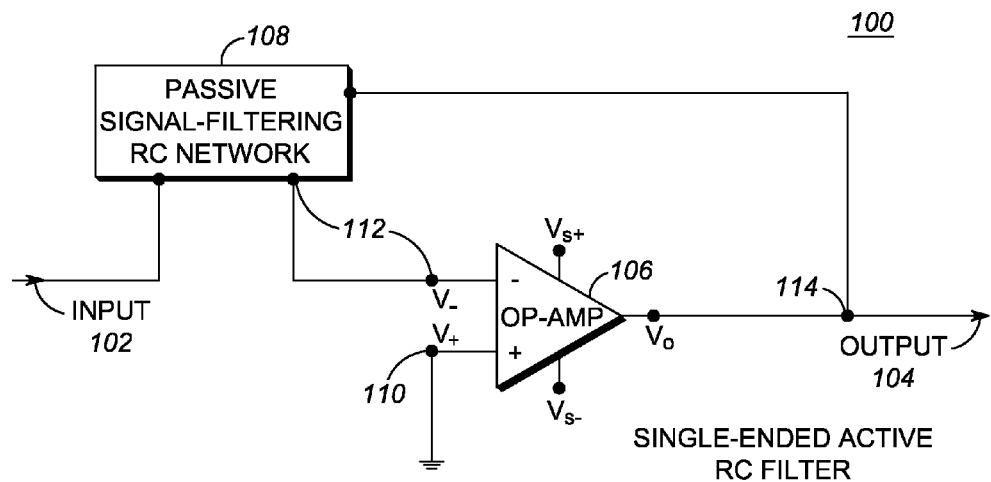
FIG. 1 is a circuit diagram of an example single-ended active RC filter.

FIG. 1 is a circuit diagram of an example single-ended active RC filter 100. The filter 100 of FIG. 1 includes a filter-circuit input 102, a filter-circuit output 104, an op-amp 106, and a passive signal-filtering RC network 108. Op-amp 106 has a non-inverting input 110, an inverting input 112, and an output 114. Passive signal-filtering RC network 108 is shown as being connected in a feedback path between the op-amp output 114, which is at the same electric potential as filter-circuit output 104, and the inverting op-amp input 112. The RC network 108 is also separately coupled to the filter-circuit input 102. The non-inverting op-amp input 110 is grounded.

Op-amp 106 has its own power source, which is represented by the nodes labeled "$V_{s+}$" and "$V_{s-}$" in FIG. 1, and may be any suitable op-amp selected by a person of skill in the art as suitable for a given implementation. This description of op-amp 106 also applies to the op-amps depicted respectively on FIGS. 2 and 4-17.

The passive signal-filtering RC network 108 may be any passive signal-filtering RC network deemed suitable by a person of skill in the art as being suitable for a given context. As is known in the art, different structures and arrangements of the circuit components used in a passive signal-filtering RC network in a filter circuit such as the one depicted in FIG. 1 can be used to effect different transfer functions for the active RC filters in which such passive RC networks are connected. Passive signal-filtering RC networks are also referred to herein as "signal-filtering segments." Furthermore, a signal-filtering segment that results in its filter circuit as a whole operating as low-pass filter may be deemed a low-pass signal-filtering segment, and likewise with respect to signal-filtering segments that result in their respective filters having other types of transfer functions. As noted above, some example types of transfer functions include low-pass filters, high-pass filters, band-pass filters, band-stop filters, and all-pass filters, though certainly many other examples abound.

As discussed, in a filter such as filter 100, the higher the attenuation of passive signal-filtering RC network 108, the higher the gain and the lower the bandwidth of the filter will be. Conversely, the lower the attenuation of passive signal-filtering RC network 108, the lower the gain and the higher the bandwidth of the filter will be. Designers, therefore, often must make tradeoffs between gain and bandwidth, as well as often among gain, Q, and bandwidth.

Figure 2:
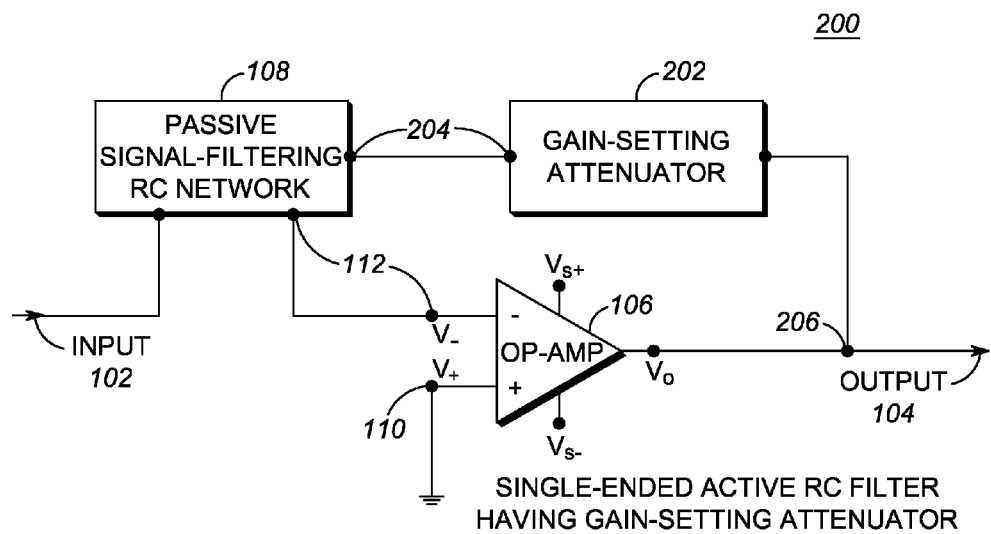
FIG. 2 is a circuit diagram of an example single-ended active RC filter having a gain-setting attenuator.

FIG. 2 is a circuit diagram of an example single-ended active RC filter 200 having a gain-setting attenuator. The filter 200 of FIG. 2 has a number of components in common with the filter 100 of FIG. 1. For brevity, these components are not also discussed in connection with FIG. 2. Furthermore, in the balance of this disclosure, for brevity and clarity of presentation, components or elements that appear in multiple figures are discussed in connection with their first appearance in the figures, and are not redundantly discussed in connection with the one or more successive additional figures in which they also appear.

Filter 100 and filter 200 differ from one another in their respective feedback paths. In filter 100, the feedback path (extending between nodes 114 and 112) includes only the passive signal-filtering RC network 108. In filter 200, however, the feedback path (extending between op-amp output node 206 and op-amp inverting input node 112) includes a gain-setting attenuator 202 coupled to node 206 and that is in series with, and coupled at an intermediate node 204 to, the passive signal-filtering RC network 108. As is further discussed below, the gain-setting attenuator 202 being in the feedback path in series with the passive signal-filtering RC network 108 converts the filter 100 (where any change in gain unavoidably causes a change in bandwidth and/or Q) into the filter 200 (for which gain can be changed independent of bandwidth and independent of Q).

Figure 3:
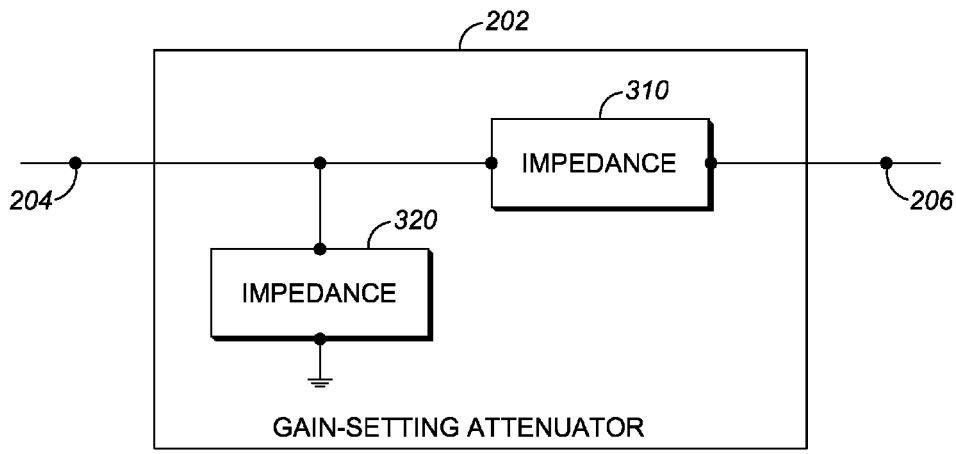
FIG. 3 is a circuit diagram of the gain-setting attenuator of FIG. 2.

FIG. 3 is a circuit diagram of the gain-setting attenuator of FIG. 2. The gain-setting attenuator 202 of FIG. 3 is presented by way of example, as those of skill in the art could select other types of gain-setting attenuators in different contexts. The gain-setting attenuator 202 includes an impedance 310 and an impedance 320. The impedance 310 is connected between node 206 and node 204, while the impedance 320 is connected between node 204 and ground. As such, the gain-setting attenuator 202 operates as a voltage divider, though in various other embodiments the gain-setting attenuator may be arranged to operate as a current divider or as any other type of gain-setting attenuator, such permutations and substitutions being within the knowledge of those of ordinary skill in the art. In at least one embodiment, both impedances 310 and 320 are resistors. In at least one such embodiment, one or both of impedances 310 and 320 are variable resistors. In at least one embodiment, both impedances 310 and 320 are capacitors. In at least one such embodiment, one or both of impedances 310 and 320 are variable capacitors. Thus, in some embodiments, the gain-setting attenuator 202 is adjustable during operation. It is further noted that both high-pass and band-pass filters present contexts suitable for implementation of impedances 310 and 320 as capacitors. Moreover, the manner in which the inclusion of the gain-setting attenuator 202 adds a degree of freedom to filter 200 vs. filter 100 is discussed more fully below in connection with FIGS. 6 and 7.

Figure 4:
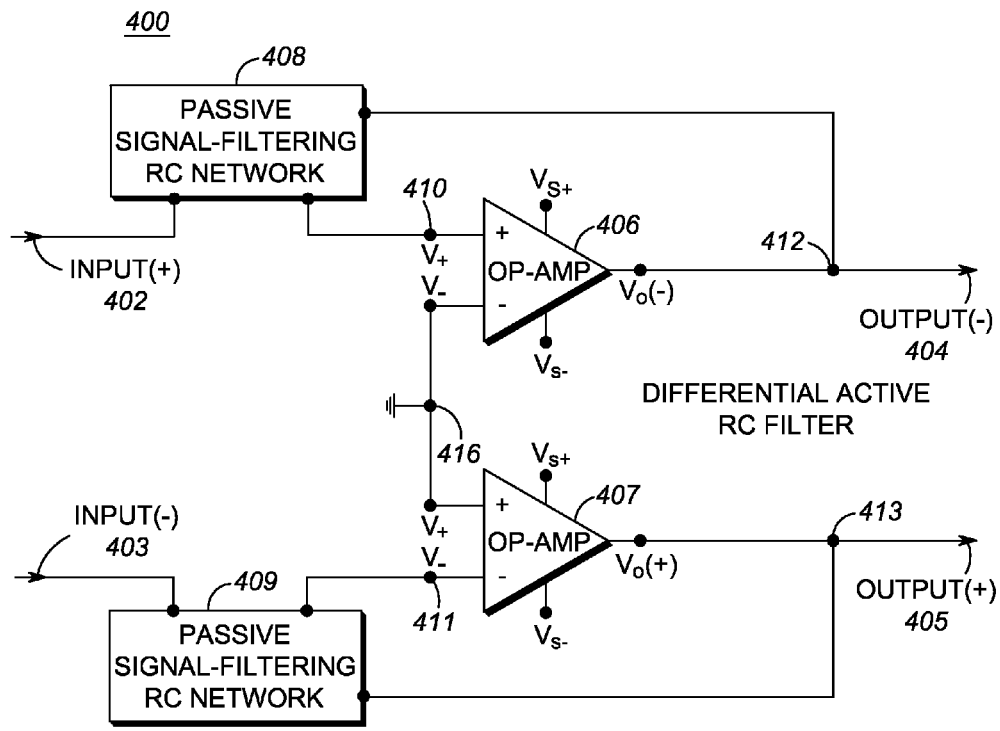
FIG. 4 is a circuit diagram of an example differential active RC filter.

FIG. 4 is a circuit diagram of an example differential active RC filter 400. The filter 400 is similar in many aspects to the filter 100 of FIG. 1. Moreover, similar components of filters 100 and 400 are numbered similarly. For example, the passive signal-filtering RC network 408 of filter 400 may take the same form as the passive signal-filtering RC network 108 of filter 100. As stated above, this numbering convention applies to the figure set as a whole.

Furthermore, in FIG. 4 and in the other figures, paired elements (such as differential inputs 402 and 403, passive signal-filtering RC networks 408 and 409, and so on) are numbered consecutively. In FIGS. 12-17, some elements having matching properties are numbered in pairs (such as the two resistors denoted R1 in FIG. 12, the two capacitors denoted C5 in FIG. 12, and so on). As recognized by those of skill in the art, filter 400 is an extension of (the single-ended) filter 100 to a differential topology. Filter 400 includes differential filter-circuit inputs 402 and 403, differential filter-circuit outputs 404 and 405, op-amps 406 and 407 (which, as is known in the art, could instead be a single op-amp having both differential inputs and differential outputs), and passive signal-filtering RC networks 408 and 409 as the feedback paths of op-amps 406 and 407, respectively. Node 410 connects passive signal-filtering RC network 408 to the non-inverting input of op-amp 406 while node 411 connects passive signal-filtering RC network 409 to the inverting input of op-amp 407. Passive signal-filtering RC network 408 further is coupled to input 402 of filter 400 and passive signal-filtering RC network 409 further is coupled to input 403 of filter 400. This arrangement is presented by way of example and not limitation.

Figure 5:
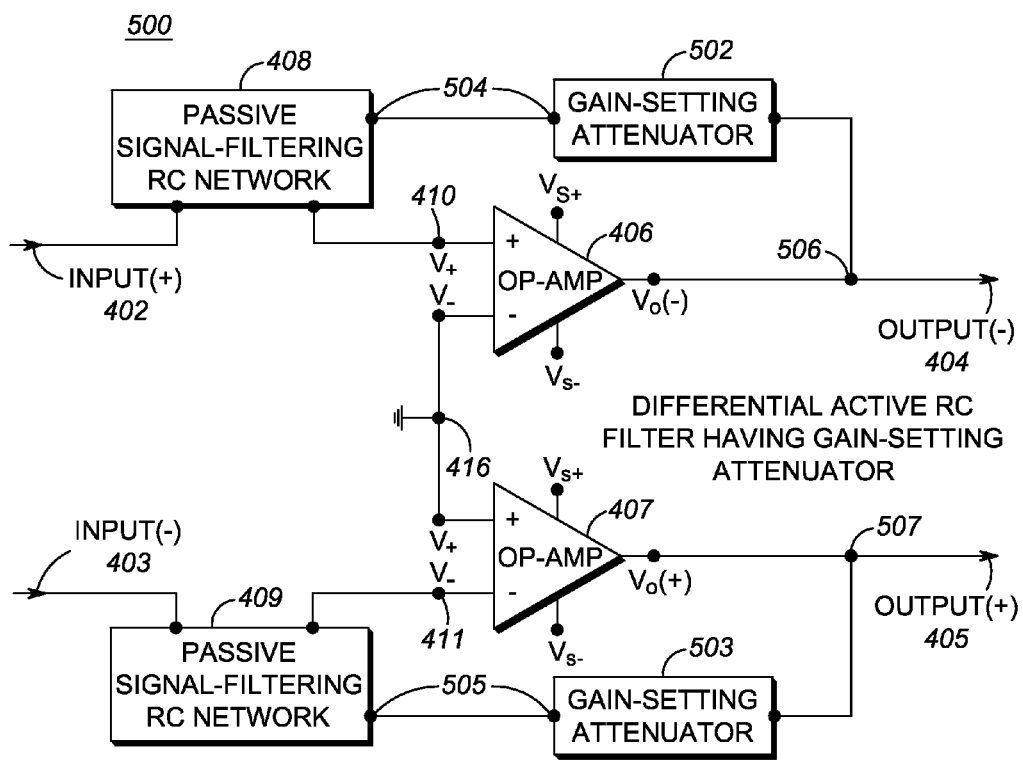
FIG. 5 is a circuit diagram of an example differential active RC filter having a gain-setting attenuator.

FIG. 5 is a circuit diagram of an example differential active RC filter 500 having a gain-setting attenuator. In general, filter 500 is to filter 400 as filter 200 is to filter 100. As can be seen in FIG. 5, filter 500 has a first feedback path (extending between output node 506 of op-amp 406 and node 410) that includes a gain-setting attenuator 502 in series with, and connected at an intermediate node 504 to, the passive signal-filtering RC network 408. The filter 500 also has a second feedback path (extending between output node 507 of op-amp 407 and node 411) that includes a gain-setting attenuator 503 in series with, and connected at a node 505 to, passive signal-filtering network 409. As discussed below, gain-setting attenuators 502 and 503 determine the gain of filter 500 without impacting its bandwidth.

Figure 8:
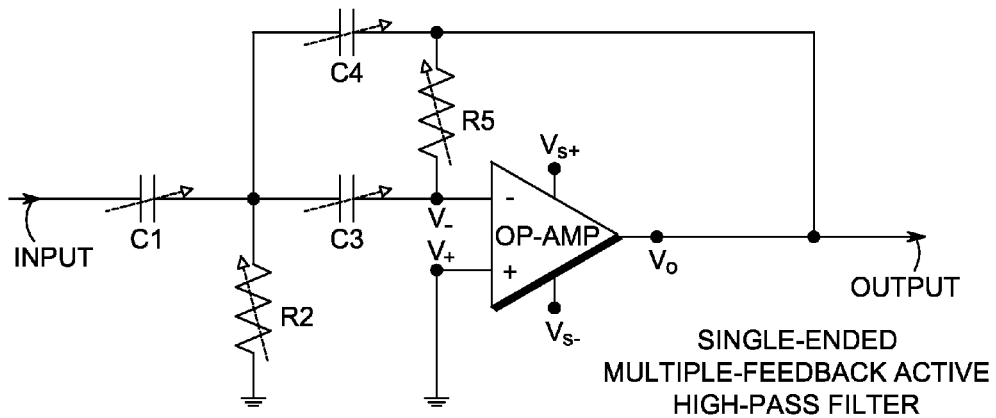
FIG. 8 is a circuit diagram of an example single-ended multiple-feedback active high-pass filter.
Figure 9:
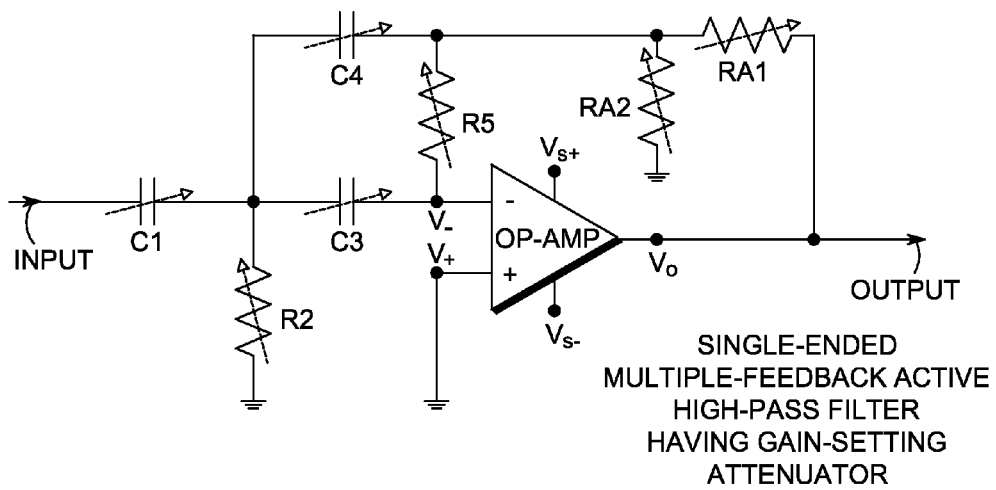
FIG. 9 is a circuit diagram of an example single-ended multiple-feedback active high-pass filter having a gain-setting attenuator.

For further illustration, single-ended and doubled-ended low-pass, high-pass, and band-pass filters are depicted in and described in connection with FIGS. 6-17, which are arranged as successive pairs (FIGS. 6 and 7 being the first pair, FIGS. 8 and 9 the second, and so on). Within each pair of figures, the first depicts a given filter and the second depicts that same filter where each feedback path in the filter's topology includes a gain-setting attenuator segment in series with a signal-filtering segment (such as a passive signal-filtering RC network). In each such pair of figures, then, the gain, bandwidth, and Q of the depicted filter are interdependent in the first figure and independent in the second. And though these figures depict single-ended and differential low-pass, high-pass, and band-pass filters, this is by way of example and not limitation, as this disclosure and the concepts described herein could be applied just as well to band-stop filters, all-pass filters, elliptic filters, Chebyshev filters, Butterworth filters, Tow-Thomas filters, Sallen-Key filters, and/or one or more other types of filters known to those of skill in the art.

Figure 6:
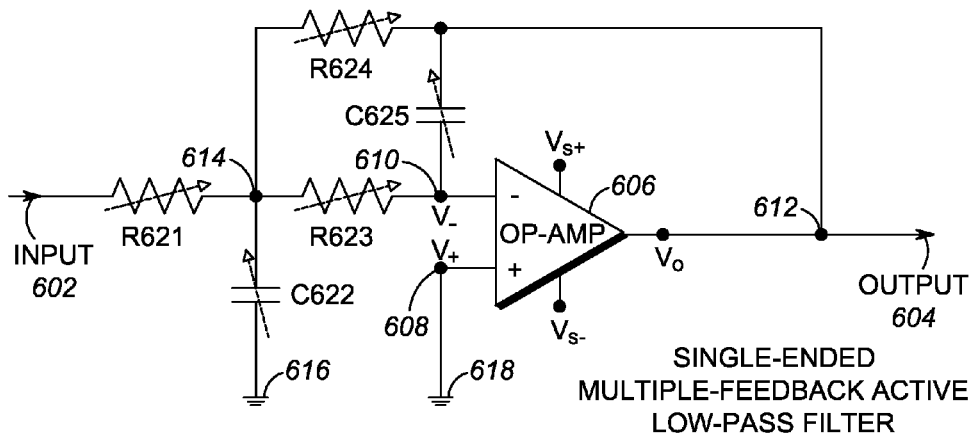
FIG. 6 is a circuit diagram of an example single-ended multiple-feedback active low-pass filter.

FIG. 6 is a circuit diagram of an example single-ended multiple-feedback active low-pass filter 600. Those of skill in the art will appreciate that filter 600 of FIG. 6 has the topology of filter 100 of FIG. 1, though filter 600 is depicted with a specific arrangement of circuit elements making up its passive signal-filtering RC network, whereas filter 100 is depicted without such specifics. In FIG. 6, as is the case with all of the ensuing figures, resistors are denoted with reference numerals beginning with "R" while capacitors are denoted with reference numerals beginning with "C". And as is the case with other figures, the dashed arrow overlaying various circuit elements indicates that those elements could be variable or non-variable components.

The signal-filtering segment of filter 600 of FIG. 6 includes a resistor R621 coupled between an input 602 of filter 600 and a node 614, a capacitor C622 coupled between node 614 and a ground 616, a resistor R623 coupled between node 614 and an inverting input 610 of an op-amp 606, a resistor R624 coupled between node 614 and an output 612 of an op-amp 606, and a capacitor C625 coupled between resistor R624 and the inverting input of an op-amp 606. Due to these circuit elements being connected in the depicted configuration, filter 600 operates as a low-pass filter. Filter 600 has a feedback path (extending between nodes 612 and 610) that includes only this signal-filtering segment, which is also coupled with input 602. The non-inverting input of op-amp 606 is connected to ground 618 at node 608.

As described above, any increase in the overall attenuation of the signal-filtering segment (by, e.g., increasing the value of R624) will result in filter 600 having both higher gain and lower bandwidth. Conversely, any decrease in the overall attenuation of the signal-filtering segment (by, e.g., decreasing the value of R624) will result in filter 600 having both lower gain and higher bandwidth. In particular, as is known to those of skill in the art, the gain ($H_o$) of filter 600 is given by Equation 1 (where resistor R624 is denoted $R_{624}$, and so on):

$$H_o = \left[-\left(\frac{R_{624}}{R_{621}}\right)\right] \quad \text{(Equation 1)}$$

The bandwidth ($\omega_o$) of filter 600 is given by Equation 2:

$$\omega_o = \frac{1}{(R_{623}R_{622}R_{624}R_{625})^{\frac{1}{2}}} \quad \text{(Equation 2)}$$

The Z($\zeta$), which the reader will recall is the inverse of the Q, of filter 600 is given by Equation 3:

$$\zeta = \left(\frac{1}{2}\right)\left(\frac{C_{625}}{C_{622}}\right)^{\frac{1}{2}}\left[\left(\frac{R_{623}}{R_{624}}\right)^{\frac{1}{2}}\left(1 + \frac{R_{624}}{R_{621}}\right) + \left(\frac{R_{624}}{R_{623}}\right)^{\frac{1}{2}}\right] \quad \text{(Equation 3)}$$

The above equations collectively illustrate that a change in the gain of filter 600 can be effected only by changing the ratio of R624 to R621. This could of course be done in different ways by changing one or both of the values of R624 and R621. Any change in R624 results in a countervailing change (i.e., increasing if the other decreases, and vice versa) in the bandwidth of the filter. Moreover, if R621 is not changed, any change in R624 results in a correlated change in the gain. As a general matter, then, and without exhaustively discussing all of the dependencies present in the above system of equations, it will be appreciated by those of skill in the art that (i) the gain depends on the ratio of R624 to R621, (ii) the bandwidth depends on R624, and (iii) the Z (and thus the Q) depends on both R624 and on the ratio of R624 to R621. Such interdependence limits design choices.

Figure 7:
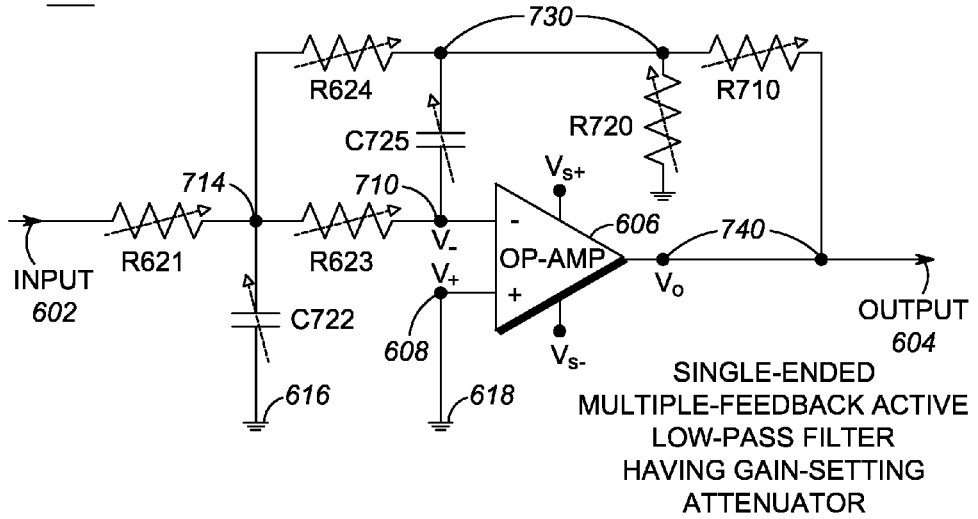
FIG. 7 is a circuit diagram of an example single-ended multiple-feedback active low-pass filter having a gain-setting attenuator.

FIG. 7 is a circuit diagram of an example single-ended multiple-feedback active low-pass filter 700 having a gain-setting attenuator. Unlike filter 600, filter 700 has a feedback path (extending between output node 740 of op-amp 606 and inverting input 710 of the op-amp) that includes a gain-setting attenuator segment coupled to output node 740 and that is in series with, and coupled at an intermediate node 730 to, substantially the same signal-filtering segment that is present in filter 600. It is noted, however, that filter 700 has capacitors C722 and C725 in place of capacitors C622 and C625, respectively; the changes in capacitor value at these two points in the filter circuit are further discussed below. The gain-setting attenuator segment of filter 700 includes a resistor R710 coupled between output node 740 and node 730, and a resistor R720 coupled between node 730 and ground, i.e., that are arranged in a manner similar to that of impedance 310 and impedance 320 of FIG. 3. Given the revised topology of filter 700 as compared with that of filter 600, the gain ($H_o$), bandwidth ($\omega_o$), and Z($\zeta$) equations for filter 700 are as follows:

$$H_o = \left(\frac{R_{710} + R_{720}}{R_{720}}\right)\left[-\left(\frac{R_{624}}{R_{621}}\right)\right] \quad \text{(Equation 4)}$$

$$\omega_o = \frac{1}{(R_{623}C_{722}R_{624}C_{725})^{\frac{1}{2}}} \quad \text{(Equation 5)}$$

$$\zeta = \left(\frac{1}{2}\right)\left[\left(\frac{R_{720}}{R_{710} + R_{720}}\right)\left(\frac{C_{725}}{C_{722}}\right)\right]^{\frac{1}{2}}\left[\left(\frac{R_{623}}{R_{624}}\right)^{\frac{1}{2}}\left(1 + \frac{R_{624}}{R_{621}}\right) + \left(\frac{R_{624}}{R_{623}}\right)^{\frac{1}{2}}\right] \quad \text{(Equation 6)}$$

It can be appreciated from Equation 4 that the gain of filter 700 can be set (i.e., set or adjusted) by setting the value of resistor R710 and/or the value of resistor R720. Furthermore, it can be appreciated from Equation 5 that neither R710 nor R720 have any bearing on the bandwidth calculation. As such, the gain of filter 700 can be set independent of the bandwidth of filter 700, making it possible for filter 700 to operate both with a high gain and a high bandwidth, i.e., for the gain to be selectable independent of the bandwidth.

The inclusion of the gain-setting attenuator segment in the circuit of filter 700 also increases the options from which a circuit designer can choose with respect to the capacitors in the signal-filtering segment of the filter circuit, when attempting to achieve a desired Z (and therefore Q) for the filter circuit as a whole. It can be appreciated from Equation 3 that, in order to obtain a desired Z (and therefore Q) for filter 600 of FIG. 6, the designer would select respective values for capacitors C622 and C625 to endeavor to achieve a desired ratio of C625 to C622. (The designer would of course also select respective values for resistors R621, R623, and R624.)

As to the two capacitors, if the desired ratio of their values (capacitances) is sufficiently high or sufficiently low, it is often necessary to select one capacitor that is quite large and one capacitor that is quite small. At the large end of that spectrum, space on a given circuit board often becomes a scarce resource. At the small end, it often becomes a design issue that the capacitance of very small capacitors may not differ materially from that of the connecting wires themselves, to some degree resulting in the circuit operating substantially as it would if that small capacitor was omitted entirely; as is known to those in the art, this phenomenon is sometimes referred to as the small capacitor being "vulnerable (or subject) to parasitics."

Moreover, it can be appreciated from Equations 3 and 6 that, other things being equal, the higher the ratio of C625 to C622 (or C725 to C722 in FIG. 7), the lower the Z will be (and thus the higher the Q will be) for the respective filter as a whole. Conversely, the lower the ratio of C625 to C622 (or C725 to C722 in FIG. 7), the higher the Z will be (and thus the lower the Q will be) for the filter circuit as a whole. As described above, the inclusion of the gain-setting attenuator segment in filter 700 increases the designer's options with respect to capacitors. This is shown by the following equation (note: in this example, $C_{625}/C_{622}$ is both the actual capacitor ratio for filter 600 and the desired effective capacitor ratio for filter 700):

$$\left(\frac{C_{625}}{C_{622}}\right) = \left(\frac{R_{720}}{R_{710} + R_{720}}\right)\left(\frac{C_{725}}{C_{722}}\right) \quad \text{(Equation 7)}$$

Both R710 and R720 are positive values, and thus the fraction of R720 over the sum of R710 and R720 has a value of less than one. As such, the capacitance values of C722 and C725 can and will be closer to one another than the values of C622 and C625 are to one another. In one example, R710 is nine times greater than R720 (e.g., R710 could be 90 Ohms and R720 could be 10 Ohms), making ((R720)/(R710+R720)) equal to (1/10). In the same example, the ratio of C625:C622 equals 1:100 (e.g., C625 could be 2 Ohms and C622 could be 200 Ohms) In this example, it can be appreciated from the discussion above and from Equation 7 that values for C725 and C722 in filter 700 could be chosen such that C725:C722 equals 1:10 (as opposed to 1:100 in filter 600). In one such example, the values used in filter 700 could be C725 equal to 8 Ohms and C722 equal to 80 Ohms Such an example clearly illustrates that inclusion in filter 700 of the gain-setting attenuator enables a designer to achieve an effective capacitor ratio in filter 700 that equals the actual (and, not incidentally, also the effective) capacitor ratio of filter 600 with capacitor values that are more advantageous from a design standpoint. On the low end, the 8-Ohm capacitor will be less vulnerable to parasitics than would the 2-Ohm capacitor (and indeed the 8-Ohm capacitor may not be at all vulnerable to parasitics). On the high end, the 80-Ohm capacitor will occupy less surface area on the circuit board than would the 200-Ohm capacitor. And many other examples are possible that would similarly show that the inclusion of the gain-setting attenuator makes both low Z values (and thus high Q values) and high Z values (and thus low Q values) achievable with components that are less subject to parasitics on one end of the spectrum and occupy less space (and dissipate less energy) on the other.

Figure 12:
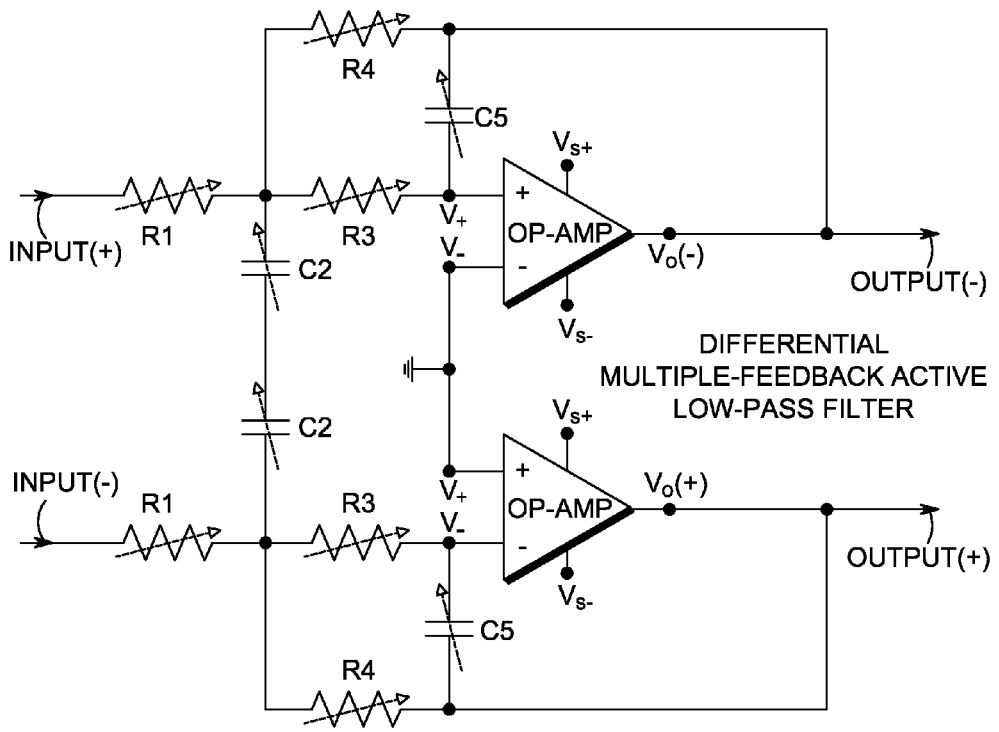
FIG. 12 is a circuit diagram of an example differential multiple-feedback active low-pass filter.
Figure 13:
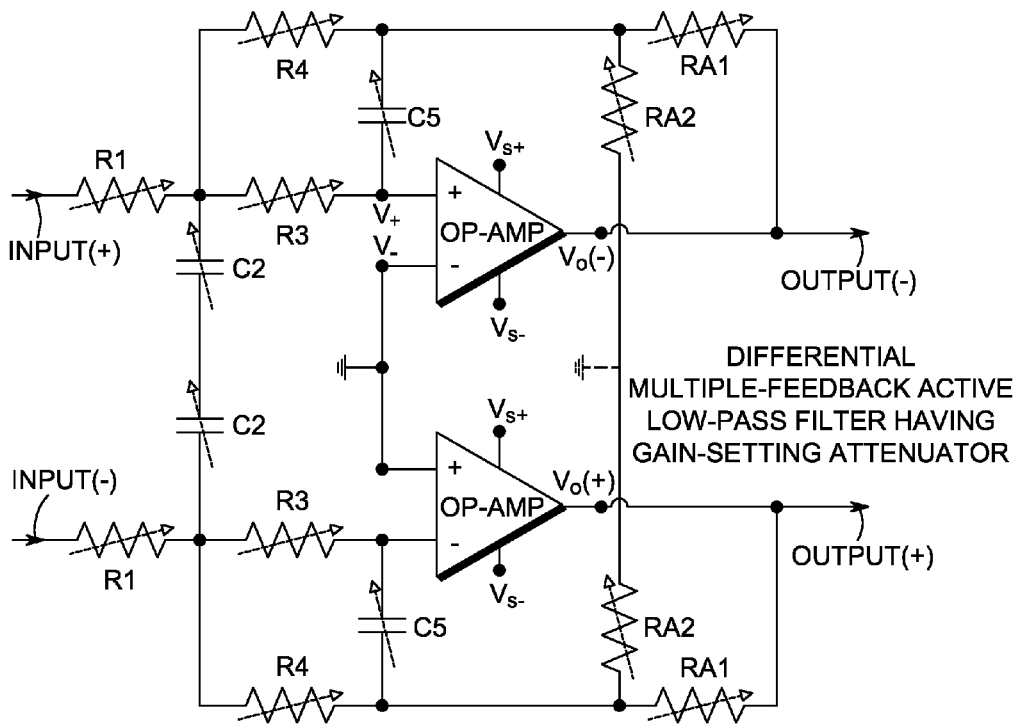
FIG. 13 is a circuit diagram of an example differential multiple-feedback active low-pass filter having a gain-setting attenuator.
Figure 14:
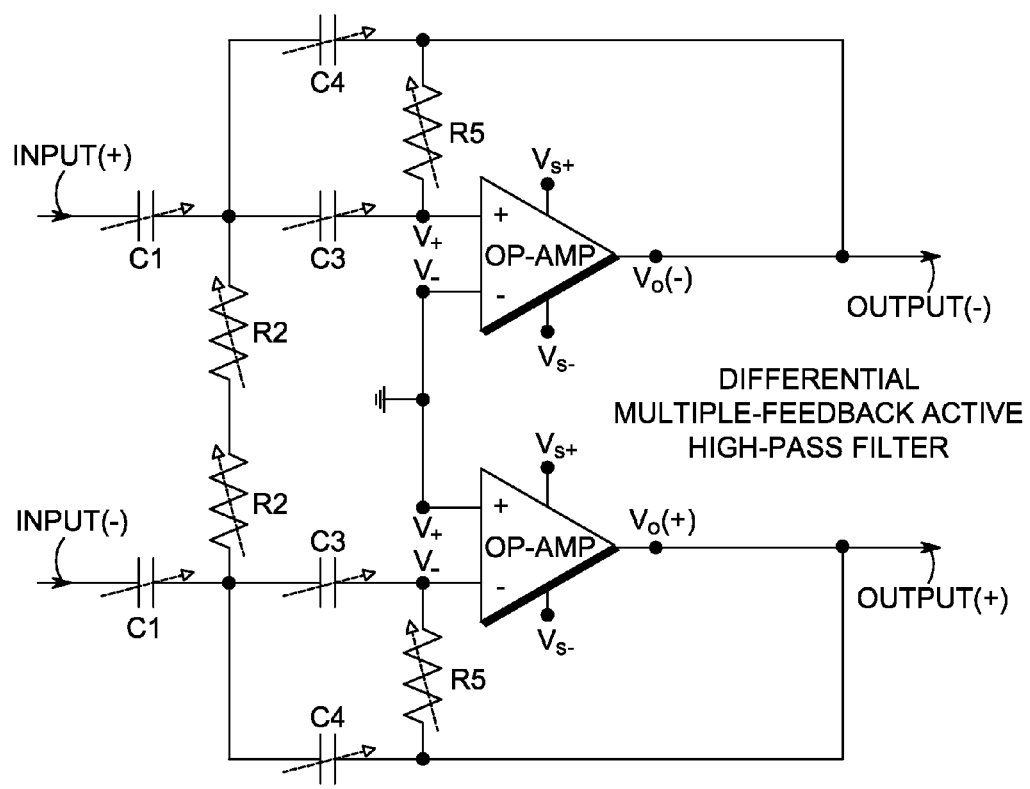
FIG. 14 is a circuit diagram of an example differential multiple-feedback active high-pass filter.
Figure 15:
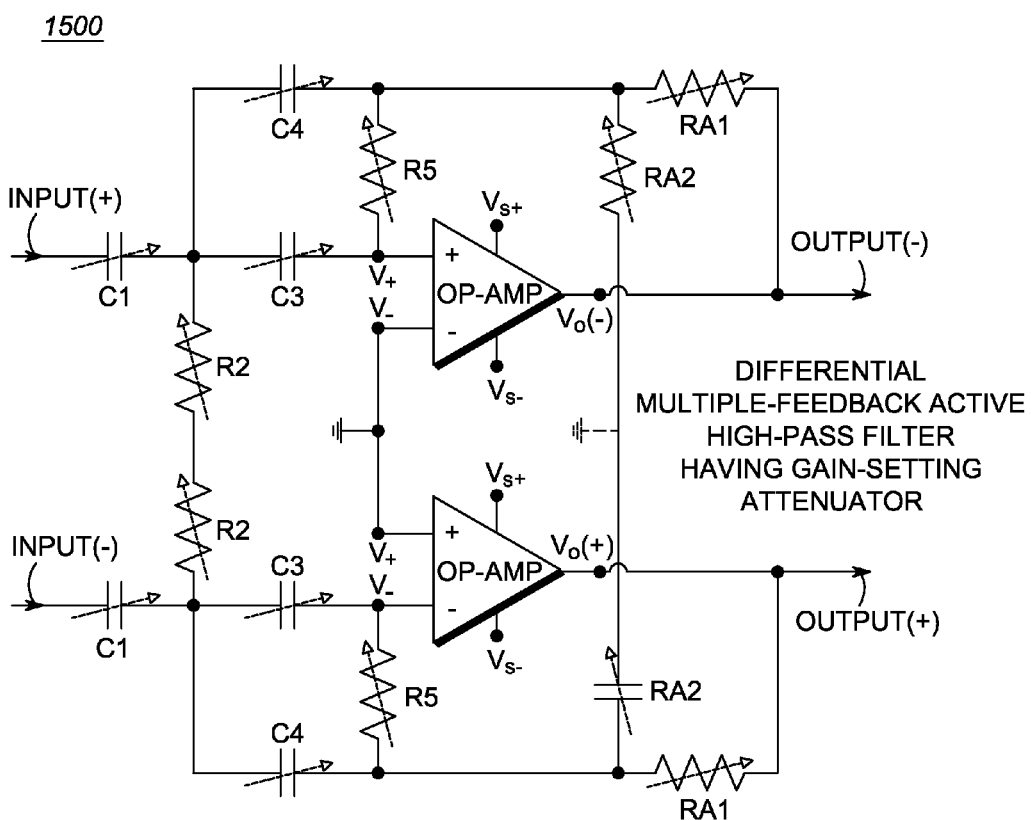
FIG. 15 is a circuit diagram of an example differential multiple-feedback active high-pass filter having a gain-setting attenuator.
Figure 16:
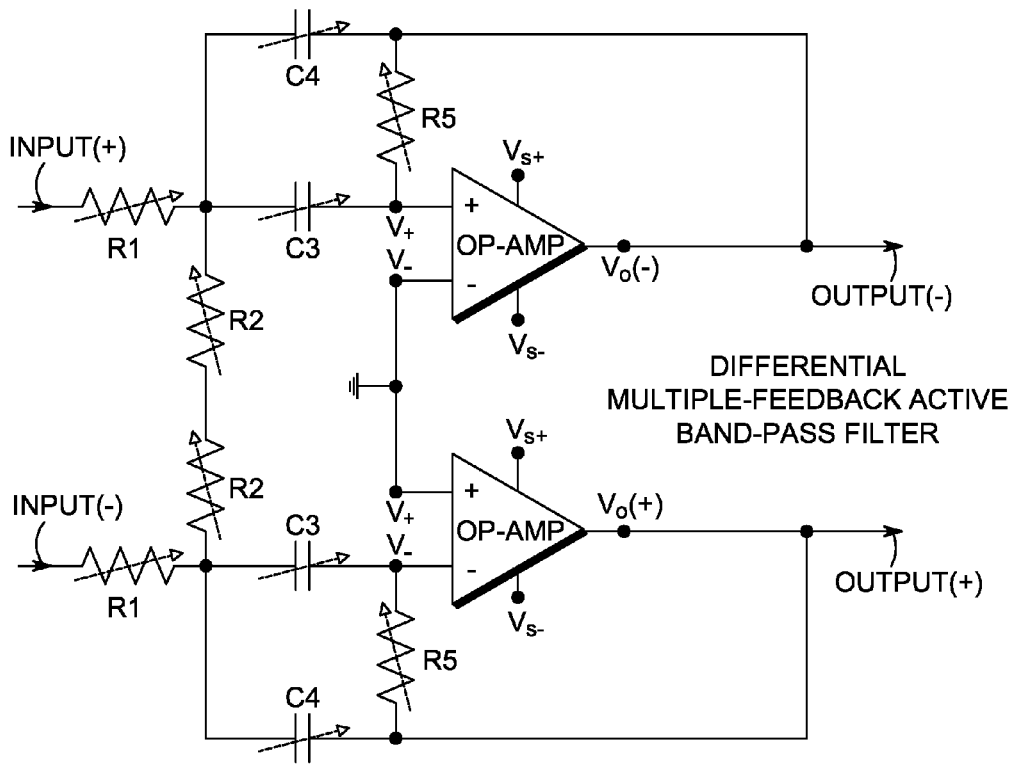
FIG. 16 is a circuit diagram of an example differential multiple-feedback active band-pass filter.
Figure 17:
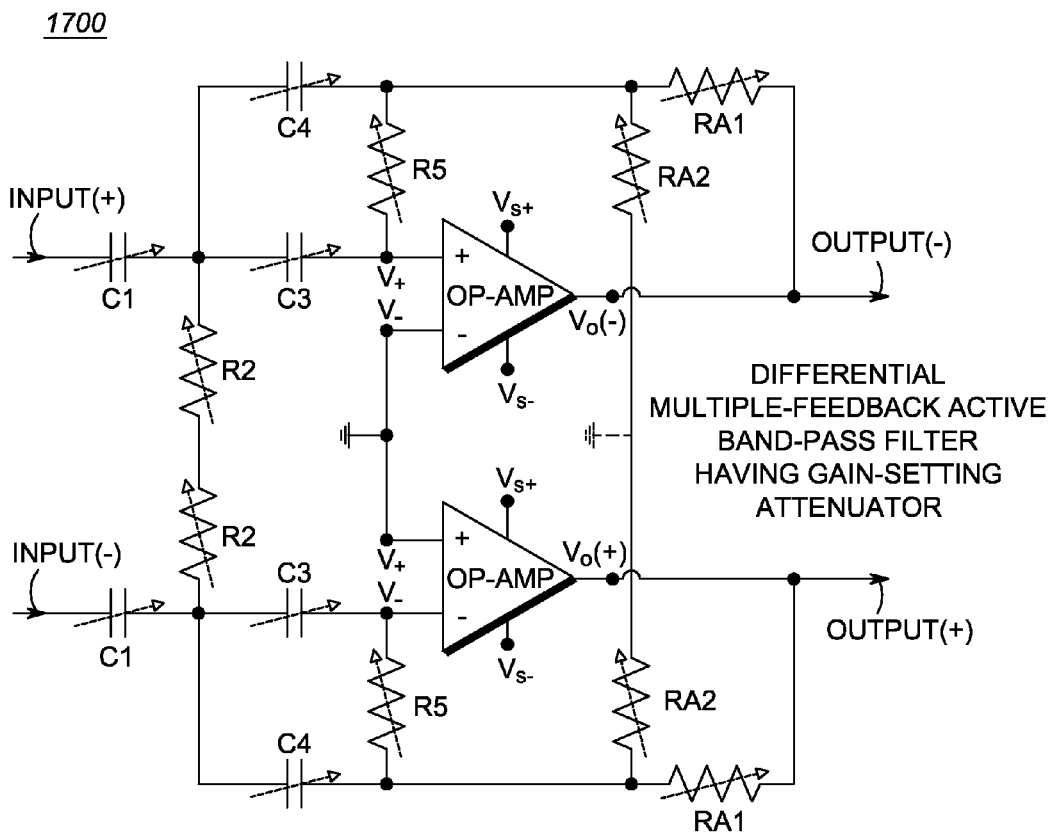
FIG. 17 is a circuit diagram of an example differential multiple-feedback active band-pass filter having a gain-setting attenuator.

By way of further examples, the remaining ten figures (i.e., FIGS. 8-17) are provided as five pairs of figures, as described above. FIGS. 8 and 9 depict (i) a single-ended multiple-feedback active high-pass filter 800 and (ii) a single-ended multiple-feedback active high-pass filter 900, which has a gain-setting attenuator in accordance with the present disclosure. In FIGS. 8 and 9, as is the case with the remaining figures (i.e., FIGS. 10-17), the capacitors and resistors in the signal-filtering segment of the respective filter circuits are denoted with labels such as "C1," "R2," and the like, while the resistors (which, as known to those in the art, could in some embodiments instead be capacitors) in the gain-setting attenuator segment are denoted with labels such as "RA1," "RA2". Furthermore, in FIGS. 12-17, components having matching properties are denoted with matching labels, such as the two resistors labeled "R1" in FIG. 12. Moreover, FIGS. 13, 15, and 17 depict a virtual ground between the two resistors denoted RA2. Furthermore, though not depicted, a virtual ground would also be present between the two capacitors denoted C2 in both FIG. 12 and FIG. 13, and also between the two resistors denoted R2 in each of FIGS. 14-17.

Figure 10:
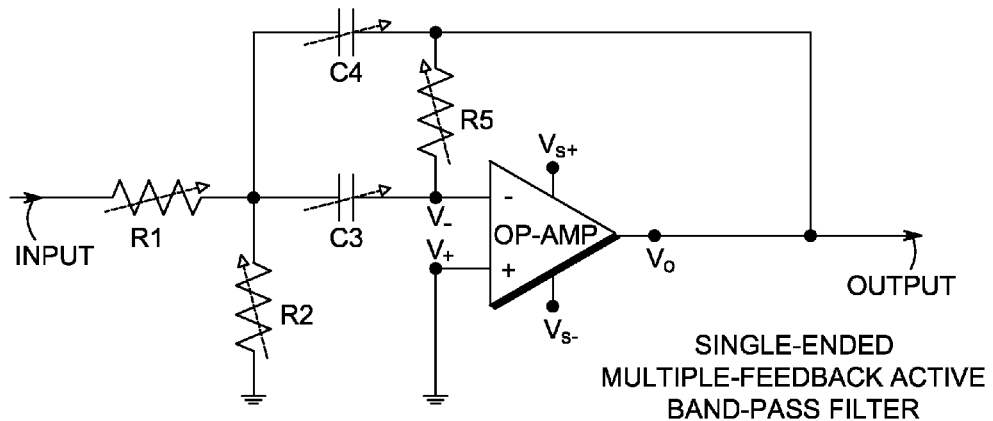
FIG. 10 is a circuit diagram of an example single-ended multiple-feedback active band-pass filter.
Figure 11:
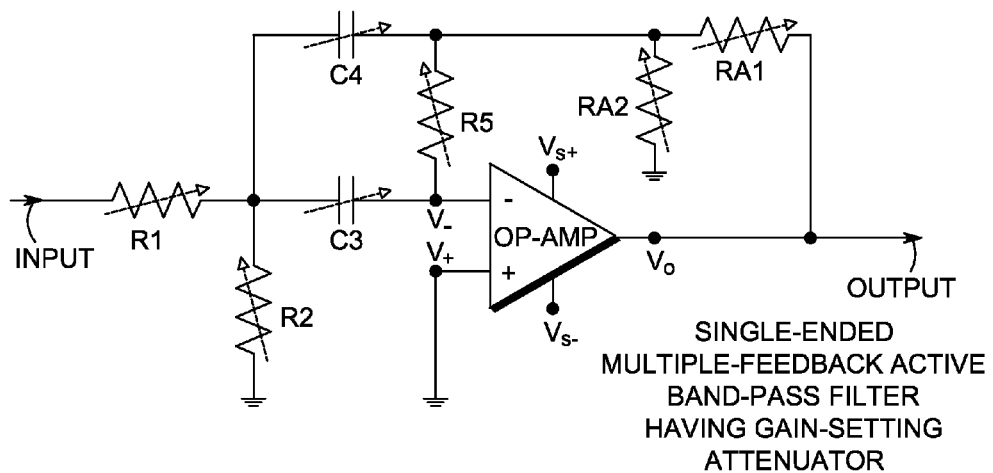
FIG. 11 is a circuit diagram of an example single-ended multiple-feedback active band-pass filter having a gain-setting attenuator.

FIGS. 10 and 11 depict (i) a single-ended multiple-feedback active band-pass filter 1000 and (ii) a single-ended multiple-feedback active band-pass filter 1100, which has a gain-setting attenuator. FIGS. 12 and 13 depict (i) a differential multiple-feedback active low-pass filter 1200 and (ii) a differential multiple-feedback active low-pass filter 1300, which has a gain-setting attenuator. FIGS. 14 and 15 depict (i) a differential multiple-feedback active high-pass filter 1400 and (ii) a differential multiple-feedback active high-pass filter 1500, which has a gain-setting attenuator. FIGS. 16 and 17 depict (i) a differential multiple-feedback active band-pass filter 1600 and (ii) a differential multiple-feedback active band-pass filter 1700, which has a gain-setting attenuator. As stated above, these example circuits are provided by way of illustration and not limitation, as other examples abound.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

I claim:

1. A filter circuit comprising:
a filter-circuit input node;
a filter-circuit output node;
an operational amplifier (op-amp) comprising first and second op-amp inputs, the op-amp further comprising an op-amp output coupled to the filter-circuit output node; and
a passive feedback path extending between the filter-circuit output node and the first op-amp input, the passive feedback path comprising a variable gain-setting attenuator for varying filter circuit gain separate from and in series with a signal-filtering RC network for varying filter circuit bandwidth and quality factor, such that filter circuit gain can be changed independently without impacting filter circuit bandwidth or quality factor.

2. The filter circuit of claim 1, wherein the variable gain-setting attenuator comprises a voltage divider.

3. The filter circuit of claim 2, wherein the voltage divider comprises first and second impedances.

4. The filter circuit of claim 3, wherein the first impedance comprises a first resistor, and wherein the second impedance comprises a second resistor.

5. The filter circuit of claim 4, wherein at least one of the first resistor and the second resistor is a variable resistor.

6. The filter circuit of claim 5, wherein each of the first resistor and the second resistor is a variable resistor.

7. The filter circuit of claim 3, wherein the first impedance comprises a first capacitor, and wherein the second impedance comprises a second capacitor.

8. The filter circuit of claim 7, wherein at least one of the first capacitor and the second capacitor is a variable capacitor.

9. The filter circuit of claim 8, wherein both of the first capacitor and the second capacitor is a variable capacitor.

10. The filter circuit of claim 1, wherein the signal-filtering RC network comprises one of a low-pass signal-filter, a high-pass signal-filter, and a band-pass signal-filter.

11. The filter circuit of claim 1, wherein the signal-filtering RC network comprises a band-stop signal-filter.

12. The filter circuit of claim 1, wherein the signal-filtering RC network comprises an all-pass signal-filter.

13. The filter circuit of claim 1, wherein the filter-circuit input node is a first differential filter-circuit input node, the filter-circuit output node is a first differential filter-circuit output node, the op-amp is a first op-amp, the op-amp output is a first op-amp output, the passive feedback path is a first passive feedback path, the variable gain-setting attenuator is a first variable gain-setting attenuator, and the signal-filtering RC network is a first signal-filter, the filter circuit further comprising:
a differential input comprising the first differential filter-circuit input node and a second differential filter-circuit input node;
a differential output comprising the first differential filter-circuit output node and a second differential filter-circuit output node;
a second op-amp comprising third and fourth op-amp inputs, the second op-amp further comprising a second op-amp output coupled to the second differential filter-circuit output node; and
a second passive feedback path extending between the second differential filter-circuit output node and the third op-amp input, the second passive feedback path comprising a second variable gain-setting attenuator in series with a second signal-filtering RC network.

14. The filter circuit of claim 1, wherein a first node of the variable gain-setting attenuator is coupled to the op-amp output and a second node of the variable gain-setting attenuator is coupled to the signal-filtering RC network.

15. A filter circuit comprising:
a filter-circuit input node;
a filter-circuit output node;
an operational amplifier (op-amp) comprising first and second op-amp inputs, the op-amp further comprising an op-amp output coupled to the filter-circuit output node; and
a passive feedback path extending between the filter-circuit output node and the first op-amp input, the passive feedback path comprising a variable gain-setting attenuator for varying filter circuit gain in series with a signal-filtering RC network for varying filter circuit bandwidth and quality factor, the variable gain-setting attenuator being coupled to the signal-filtering RC network at an intermediate node, the variable gain-setting attenuator extending between the filter-circuit output node and the intermediate node such that filter circuit gain can be changed independently without impacting filter circuit bandwidth or quality factor, the signal-filtering RC network extending between the intermediate node and the first op-amp input, the variable gain-setting attenuator comprising a first variable gain-setting impedance and a second gain-setting impedance, the first variable gain-setting impedance extending between the filter-circuit output node and the intermediate node, the second gain-setting impedance being coupled to the intermediate node, the first variable gain-setting impedance and the second gain-setting impedance cooperating to function as a voltage divider between the filter-circuit output node and the intermediate node.

16. The filter circuit of claim 15, wherein the second gain-setting impedance is a variable impedance.

17. The filter circuit of claim 15, wherein the signal-filtering RC network is selected from the group consisting of a low-pass signal-filter, a high-pass signal-filter, a band-pass signal-filter, a band-stop signal-filter, and an all-pass signal-filter.

18. The filter circuit of claim 15, wherein a first node of the first gain-setting impedance is coupled to the op-amp output and a second node of the first gain-setting impedance is coupled to the intermediate node, and wherein a first node of the second gain-setting impedance is coupled to the intermediate node and a second node of the second gain-setting impedance is coupled to ground.

* * * * *